United States Patent [19]

Azegami

[11] Patent Number: 4,573,142
[45] Date of Patent: Feb. 25, 1986

[54] MEMORY CIRCUIT FOR PRODUCING ANALOG OUTPUT

[75] Inventor: Tadashi Azegami, Inagi, Japan

[73] Assignee: Kabushiki Kaisha Hokushin Denki Seisakusho, Tokyo, Japan

[21] Appl. No.: 403,195

[22] Filed: Jul. 29, 1982

[30] Foreign Application Priority Data

Aug. 10, 1981 [JP] Japan .................. 56-125074

[51] Int. Cl.[4] ........................................... G11C 27/00
[52] U.S. Cl. ..................................................... 365/45
[58] Field of Search .................. 365/45, 189, 239, 240

[56] References Cited

U.S. PATENT DOCUMENTS 4,301,540 11/1981 Sato et al. ..................... 365/227

Primary Examiner—James W. Moffitt
Attorney, Agent, or Firm—Pollock, Vande Sande and Priddy

[57] ABSTRACT

H and L logic signals are written in a memory in a ratio between the numbers of the H and L logic signals corresponding to the magnitude of an analog signal. The memory is cyclically read out and the output therefrom is smoothed by a smoothing circuit to provide an analog output.

20 Claims, 21 Drawing Figures

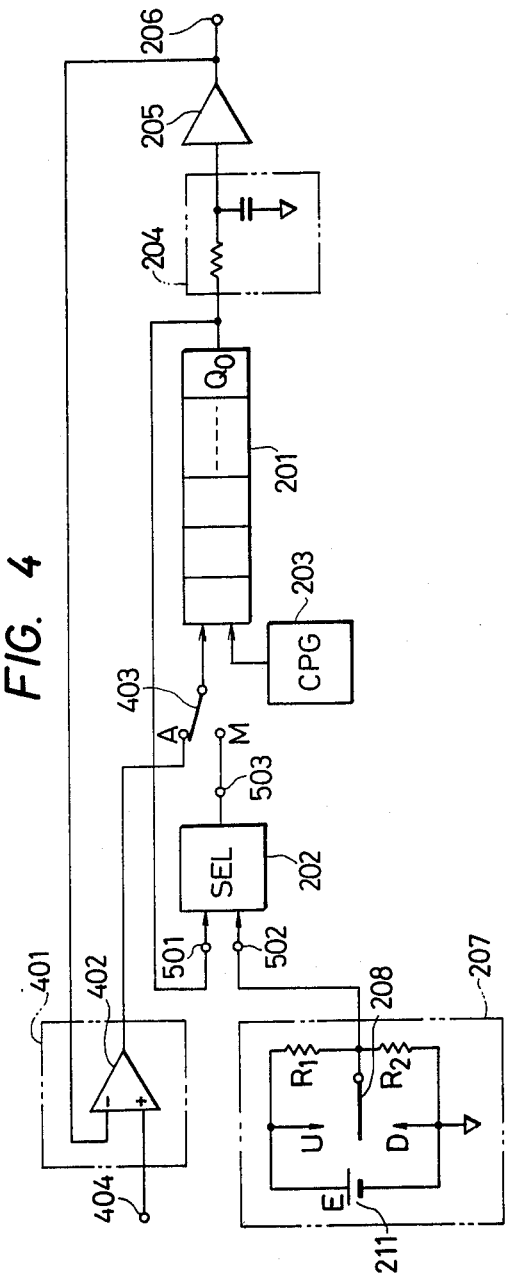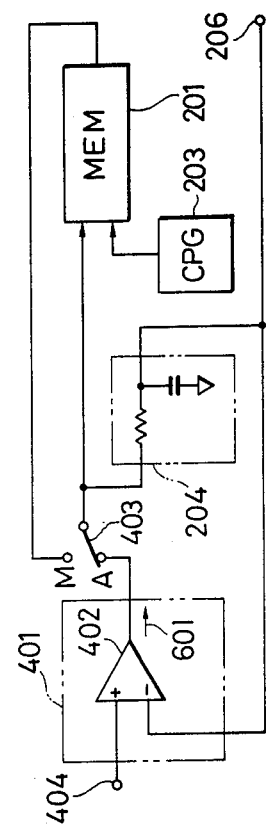
FIG. 4
FIG. 5

MEMORY CIRCUIT FOR PRODUCING ANALOG OUTPUT

BACKGROUND OF THE INVENTION

The present invention relates to a memory circuit which is designed so that when employed in an output circuit of an indicating controller, for example, it is capable of yielding a desired analog signal for a long period of time and changing the analog signal upon request.

For instance, in industrial instruments various quantities being processed, such as flow rate, pressure, error and so forth, are each measured and the measured value and its preset value are provided to an indicating controller, which performs what is called a Proportional plus Integral plus Derivative operation (PID) to obtain proportional, integral and derivative values of a deviation between the measured and the preset values and outputs an operation signal by which the opening of a valve, fuel supply and so on are controlled so that the quantities being processed may follow the preset values. The abovesaid operation signal is usually an analog signal. Recently an indicating controller of the type employing a microcomputer has come into use. In this case, its output signal is in a digital form and converted by a D/A converter to an analog form and, for utilizing the microcomputer and the D/A converter for other various processing, too, the calculated operation signal is converted to an analog signal, which is sample-held in a sample hold circuit and its sample hold output is used as an operation signal.

A conventional sample hold circuit is formed by a holding capacitor and an output buffer. In order to prevent the analog output from fluctuation, it is necessary that the holding capacitor to be of a small leak current type and that the output buffer be of extremely high impedance. Since reduction of the leak current and enhancement of the input impedance are inevitably limited, however, fluctuation of the sampled output is unavoidable in a long use. It is also possible to adopt an arrangement that detects this output variation, i.e., the so-called drift, by the microcomputer and produces a digital operation signal in a manner to compensate for the drift, but when the microcomputer is out of order, the drift cannot be avoided. That is to say, although this kind of device is adapted so that not only an operation signal is automatically derived from the indicating controller but also an operation signal may be provided by a manual operation, it is unavoidable that the output drifts during manual operation. The above is generally pointed out in respect of the case of producing an analog signal as well as the indicating controller.

SUMMARY OF THE INVENTION

It is therefore an object of the present invention to provide a memory circuit which is capable of stably producing an analog signal of a predetermined magnitude for a long time.

Another object of the present invention is to provide a memory circuit which is capable of automatically changing its output analog signal in accordance with an external analog signal.

Another object of the present invention is to provide a memory circuit which is capable of changing its output analog signal by a manual operation as well as automatically in accordance with an external analog signal.

Another object of the present invention is to provide a memory circuit which is capable of rapidly changing its output analog signal by an automatic or manual operation, that is, high in response speed.

Yet another object of the present invention is to provide a memory circuit which is suitable for use as an output circuit for operation of an indicating controller employing a microcomputer.

According to the present invention, H and L logic signals are stored in a memory, formed by a shift register random access memory or the like, in a ratio between the numbers of the H and L logic signals corresponding to the magnitude of an analog signal to be output. The memory is cyclically read out with a constant period and the signal read out therefrom is smoothed by a smoothing circuit. The smoothed output is used as an analog output. The magnitude of the output analog signal from the smoothing circuit is varied by increasing or decreasing the number of H or L logic signals through automatic or manual write means. The automatic write means is formed by a comparator, which compares an input analog signal and the smoothed output to provide the compared output for input to the memory. By dividing the memory into a plurality of areas and writing data in the individual areas, the speed of changing the output analog signal can be enhanced and the time constant of the smoothing circuit can be reduced.

As described above, according to the present invention, an analog signal is stored in the form of H and L logic signals in the memory, and the ratio of the numbers of the H and L logic signals are caused to correspond to the magnitude of the input analog signal. The duty ratio of the signal read out from the memory does not vary if the content of the memory remains unchanged, and the analog output obtained by smoothing the output signal from the memory is constant and is free from drift.

BRIEF DESCRIPTION OF THE DRAWINGS

FIG. 4 is a circuit diagram showing another embodiment of the memory circuit of the present invention which is provided with automatic and manual write means;

FIG. 5 is a circuit diagram showing another embodiment of the memory circuit of the present invention which is adapted so that its output is taken out without passing through a memory during automatic write operation;

DESCRIPTION OF THE PREFERRED EMBODIMENTS

Figure 1:
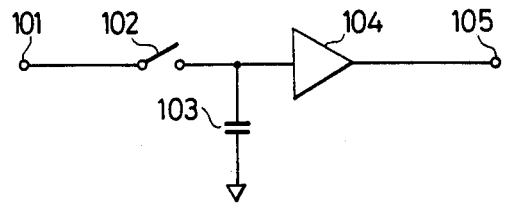
FIG. 1 is a diagram showing a conventional sample hold circuit.

To facilitate a better understanding of the present invention, a description will be given first, with reference to FIG. 1, of a conventional sample hold circuit. As is well-known in the art, this sample hold circuit is arranged so that an analog signal applied to an input terminal 101 is sampled by turning ON a sample switch 102 for a short period of time, the sampled value is stored in a holding capacitor 103 and the stored voltage is derived at an output terminal 105 via a buffer amplifier 104. With the sample hold circuit of the above construction, in order to retain the voltage value stored in the capacitor 103 for a long period of time, it is necessary that the capacitor 103 be of a characteristic of very small leak current, and that the buffer amplifier 104 be of sufficiently large input impedance. Since suppression of the leak current of the capacitor and enhancement of the input impedance of the amplifier are naturally limited, however, it is difficult to hold the voltage stored in the capacitor 103 unchanged for a long period of time.

Figure 2:
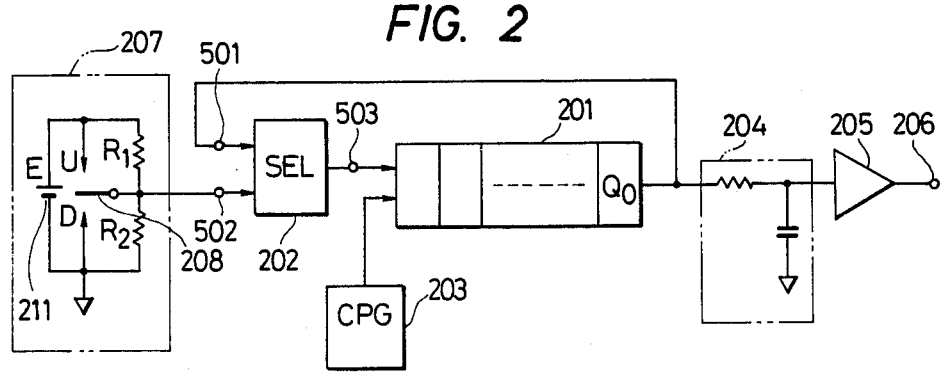
FIG. 2 is a circuit diagram illustrating an embodiment of the memory circuit of the present invention which employs a shift register as a memory.

FIG. 2 illustrates an embodiment of the present invention. In the present invention there is provided a memory 201 which can be read out cyclically. In the embodiment of FIG. 2 a shift register is employed as the memory 201 and its output is fed back to its input side via a selector 202. The contents of the memory 201 are sequentially read out from its end bit position $Q_0$ by clock pulses from a clock pulse generator 203, and binary data of each bit thus read out is rewritten via the selector 202 into the shift register 201 at its leading bit position. In this way, the data stored in the memory 201 is cyclically read out. The output thus read out from the memory 201 is smoothed by a smoothing circuit 204, regenerating an analog voltage which is dependent on the ratio $n_1/(n_1+n_2)$ where $n_1$ and $n_2$ are a number of H logic signals and a number of L logic signals in the binary data stored in the memory 201. The analog voltage from the smoothing circuit 204 is provided to an output terminal 206, if necessary, via a buffer amplifier 205.

The analog voltage value at the output terminal 206 can be altered by changing the ratio between the numbers of H and L logic signals stored in the memory 201. To this end, for instance, write means 207 is employed.

The write means 207 includes a switch 208 which is normally held at its neutral position, a voltage source 211 and dividing resistors $R_1$ and $R_2$. When the switch 208 is connected to its one contact U, H logic of a voltage E is yielded and when the switch 208 is connected to the other contact D, L logic of a voltage 0 is provided at a terminal 502. When the switch 208 is held at its neutral position, there is produced a constant divided voltage $E \cdot R_2/(R_1+R_2)$ which is predetermined by the voltage source 211 and the dividing resistors $R_1$ and $R_2$; for example, in the case where the resistance values of the resistors $R_1$ and $R_2$ are equal, a voltage $E/2$ is produced. Connecting the switch 208 to the contact U, the H logic is applied via the selector 202 to the memory 201, wherein it is written in synchronism with the clock pulses, increasing the number of the H logic signals in the memory 201. As the number of H logic signals in the memory 201 increases, the analog voltage value derived from the smoothing circuit 204 rises in the positive direction. On the other hand, when the switch 208 is connected to the contact D, L logic is applied via the selector 202 to the memory 201 and written therein in synchronism with the clock pulses. As the number of L logic signals in the memory 201 increases, the analog voltage value from the smoothing circuit 204 decreases. When the switch 208 is retained at the neutral position, the write means 207 yields the voltage $E/2$, by which the selector 202 selects the output from the memory 201 and writes it in the memory 201.

Accordingly, by a suitable operation of the switch 208, the analog voltage provided at the output terminal 206 can be set to a desired value and, by returning the switch 208 to its neutral position thereafter, the contents of the memory 201 is always read out cyclically, ensuring that its output value is semipermanently retained without drifting. This memory circuit can be applied, for example, to a manual controller of a flow rate control valve, or an output circuit of an indicating controller as described later.

Figure 15:
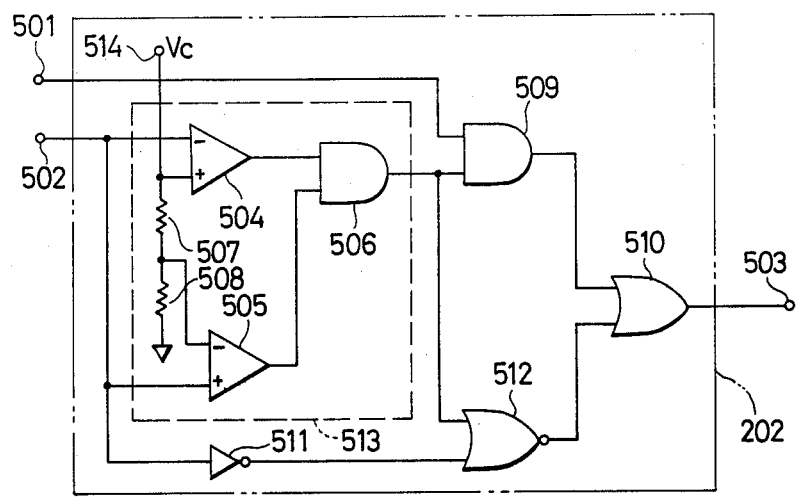
FIG. 15 is a circuit diagram showing a specific example of a selector 202 utilized in the embodiment of FIG. 2.

The selector 202 used in FIG. 2 is arranged, for instance, as shown in FIG. 15, in which terminals 501, 502 and 503 are connected to the output side of the memory 201, the output side of the write means 207 and the input side of the memory 201, respectively. The selector 202 includes a window comparator 513 which comprises comparators 504 and 505, an AND gate 506 and resistors 507 and 508. The window comparator 513, as is well-known in the art, yields H logic only when the input voltage thereto from the terminal 502 is within a predetermined range, and yields L logic when the input voltage is outside the predetermined range. This voltage range is dependent on the resistance values of the resistors 507 and 508 and a voltage $V_C$ that is applied to a terminal 514. The selector 202 of this example is designed so that the voltage which is provided from the write means 207 to the terminal 502 when the switch 208 of the write means 207 remains at the neutral position may fall within the abovesaid voltage range. For instance, in the case where H and L logic are 5 and 0 V, respectively, and a voltage obtained when the switch 208 is neutral is 2.5 V, the voltage $V_C$ and the resistance values of the resistors 507 and 508 are selected so that the abovesaid voltage range may be between 1.5 and 3.5 V.

When the switch 208 of the write means 207 is neutral, the voltage to the terminal 502 stays within the abovesaid voltage range and, accordingly, the window comparator 513 outputs the H logic to open an AND gate 509. Consequently, the output from the memory 201 to the terminal 501 is provided via the AND gate 509 and an OR gate 510 to the terminal 503 and then written in the memory 201 of FIG. 2 in synchronism with the clock. When the switch 208 of the write means 207 is connected to the contact U or D and H or L logic is applied to the terminal 502, the window comparator 513 produces L logic to close the AND gate 509, blocking the output from the memory 201 to the terminal 501, while H or L logic applied to the terminal 502 is provided via an inverter 511, a NOR gate 512 and the OR gate 510 to the terminal 503 and then written in the memory 201.

Figure 3:
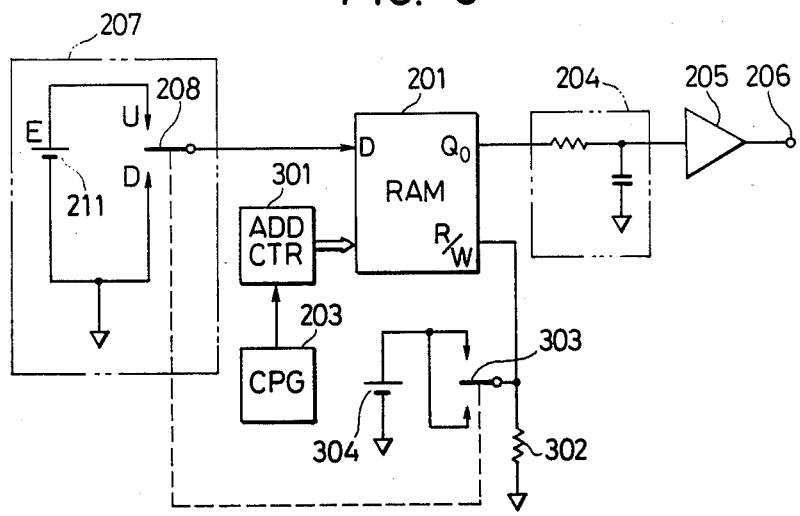
FIG. 3 is a circuit diagram illustrating another embodiment of the memory circuit of the present invention which uses a RAM as a memory.

FIG. 3 illustrates another embodiment of the present invention, in which the parts corresponding to those in FIG. 2 are identified by the same reference numerals. In this embodiment a random access memory is employed as the memory 201. In the case of using the random access memory, the clock pulses from the clock pulse generator 203 are applied to an address counter 301, the count output of which is provided to an address terminal of the memory 201 to cyclically read out the memory 201 from its leading address to its last address. The output read out from the memory 201 is smoothed by the smoothing circuit 204 and provided via the buffer amplifier 205 to the output terminal 206 as is the case with FIG. 2. A read/write terminal R/W of the memory 201 is supplied with a common potential, i.e. L logic via a resistor 302 and is held in a readout state.

The write means 207 comprises the voltage source 211 and the switch 208 which is normally neutral. Connecting the switch 208 to the contact U or D, H logic is provided from a write command signal source 304 to the read/write terminal R/W via a switch 303 ganged with the switch 208, changing it over to a write state. As a result of this, H or L logic selected by the switch 208 is written in the memory 201.

Accordingly, in the case of using the random access memory as the memory 201, too, the analog voltage corresponding to the ratio between the numbers of H and L logic signals stored in the memory can be obtained from the smoothing circuit 204 by cyclically reading out the memory. The output voltage from the smoothing circuit 204 can be changed by connecting the switch 208 to the contact U or D to change the ratio between the numbers of the H and L logic signals stored in the memory 201.

In the above arrangements, the output read out from the memory 201 is smoothed by the smoothing circuit 204 for conversion into an analog voltage but, for instance, in the case of a pulse control type flow rate control valve, the output from the memory 201 is applied thereto as it is. Accordingly, the smoothing circuit 204 is not always an indispensable constituent feature of the present invention.

From the foregoing the basic technological concept of the present invention and its operational effect will be appreciated.

While in the foregoing the content of the memory 201 is rewritten by changing over the manual switch 208, it is also possible to automatically store in the memory 201 the H and L logic signals in a ratio of their numbers corresponding to an input analog voltage.

FIG. 4 illustrates an embodiment of this latter type. Connecting a mode changeover switch 403 to a contact M, the same arrangement as in FIG. 2 is provided and the output from the memory 201 or the write means 207 is written in the memory 201 via the selector 202 depending on the state of the switch 208. In this embodiment automatic write means 401 is provided in addition to the manually operable write means 207. The automatic write means 401 is shown to be formed by a comparator 402, which outputs H or L logic depending on whether the potential at its non-invert input terminal (+) is higher or lower than the potential at its invert input terminal (−). Connecting the changeover switch 403 to a contact A, the output from the automatic write means 401 is written in the memory 201 in synchronism with the clock.

The changeover of the automatic and manual write means 401 and 207 is carried out by the mode changeover switch 403 as described above. The state in which the switch 403 is held on the side of the contact A will hereinafter be referred to as an automatic mode, and the state in which the switch 403 is held on the side of the contact M will hereinafter be referred to as a manual mode. In the automatic mode the output side of the automatic write means 401 is connected to the input side of the memory 201. The non-invert input terminal (+) of the comparator 402 forming the automatic write means 401 is connected to an analog input terminal 404 and the invert input terminal (−) is connected to the output of the buffer amplifier 205.

With such an arrangement, in the state in which the mode changeover switch 403 is held on the side of the contact A, H logic data of a number corresponding to the analog voltage value applied to an input terminal 404 and the data is cyclically read out at all times. That is to say, the output analog signal provided to the output terminal 206 always follows the analog signal applied to the input terminal 404, by which the H (or L) logic signals are stored in the memory 201 in such a manner that both the input and the output may be in equilibrium.

A more detailed description will be given of the automatic write operation. Assuming that the stored content of the memory 201 is the L logic signal in its all bits, the smoothed output voltage from the buffer amplifier 205 is zero. At this time, if a certain positive voltage is applied to the input terminal 404, then the automatic write means 401 yields H logic. This H logic is written in some bit positions of the memory 201, and the contents of the memory 201 are read out and smoothed and then fed back to the invert input terminal of the comparator 402.

When the analog input voltage to the input terminal 404 becomes lower than the output voltage, the comparator 402 produces L logic. Consequently, the L logic is written in some bit positions of the memory 201 and the automatic write means operates so that the voltage resulting from smoothing the output from the memory 201 may become nearly equal to the analog input voltage. In this way, according to the automatic write means 401, an analog quantity can be retained in the form of a ratio between the numbers of H and L logic signals in the memory 201. By changing over the mode changeover switch 403 after abovesaid equilibrium is obtained, the comparator 402 can be disconnected from the memory 201. By disconnecting the comparator 402 from the memory 201, the numbers of H and L logic signals corresponding to the magnitude of analog input signal stored in the memory 201 are semi-permanently saved (assuming that the switch 208 is held neutral) and there is no fear of the stored quantity drifting. Furthermore, the manual write means 207 can be connected by the changeover of the mode changeover switch 403 to the memory 201 and, according to the changed over state of the manual switch 208 of the manual write means 207, H and L logic are selectively applied to the input side of the memory 201, by which the analog voltage value at the output terminal 206 can be manually increased or decreased.

FIG. 5 illustrates another example of the invention, in which the smoothing circuit 204 is connected to the input side of the memory 201 and the smoothed analog output is supplied to the output terminal 206 and the inverted input of the comparator 402. That is to say, the analog input signal is applied from the input terminal 404 to the non-invert input terminal (+) of the comparator 402 and, in the state in which the mode changeover switch 403 is held on the side of the contact A, the smoothing circuit 204 is connected to the output side of the comparator 402 and its smoothed output is provided to the output terminal 206. At the same time, the smoothed output from the smoothing circuit 204 is supplied to the invert input terminal (−) of the comparator 402.

Figure 6:
FIG. 6 is a diagram showing an example of the output waveform of the automatic write means.

With such an arrangement, there are derived at the output of the comparator 402 pulses 601 such, for instance, as shown in FIG. 6 which have a duty ratio corresponding to the analog input voltage applied to the input terminal 404. The duty ratio D/T of the pulses 601 is in proportion to the analog input voltage, and its smoothed voltage becomes equal to the analog input voltage. Accordingly, the pulses 601 from the comparator 402 are provided to the memory 201 formed, for example, by a shift register, wherein they are stored. Therefore, in this example, the analog input voltage to the input terminal 404 is stored in the form of the duty ratio of the pulses 601 in the memory 201. A change in the analog input voltage to the input terminal 404 causes a change in the duty ratio D/T of the output pulses 601 from the comparator 402, also changing the duty ratio stored in the memory 201. Thus in the memory 201 are always stored H and L logic having the duty ratio corresponding to the value of the analog input voltage at the terminal 404. By changing over the mode changeover switch 403 to the side of the contact M, a write from the outside into the memory 201 is inhibited and the read output of the memory 201 is rewritten therein, that is, it circulates in the memory 201 and the cyclically read out stored content is provided to the output terminal 206, in this example, via the smoothing circuit 204. The analog voltage thus derived at the output terminal 206 is equal to the analog input voltage applied to the input terminal 404 and its value remains unchanged and does not ever drift as long as the memory 201 is driven by the clock pulse generator 203.

Although in this example the manual write means 207 is omitted, it is easy to make an arrangement wherein, when the mode changeover switch 403 is connected to the side of the manual mode M, the output voltage at the output terminal 206 is altered by using the manual write means 207 and the selector 202 shown in FIGS. 2 to 4. In such a case, though not shown, the output side of the memory 201 is not directly connected to the contact M of the changeover switch 403, but instead it is connected to one input side of the selector 202, the other input side of which is connected to the output side of the write means 207, and the output side of the selector 202 is connected to the terminal of the changeover switch 403 on the side of the contact M. Further, it will easily be understood that a random access memory can be employed as the memory 201 in the embodiments of FIGS. 4 and 5.

Figure 7:
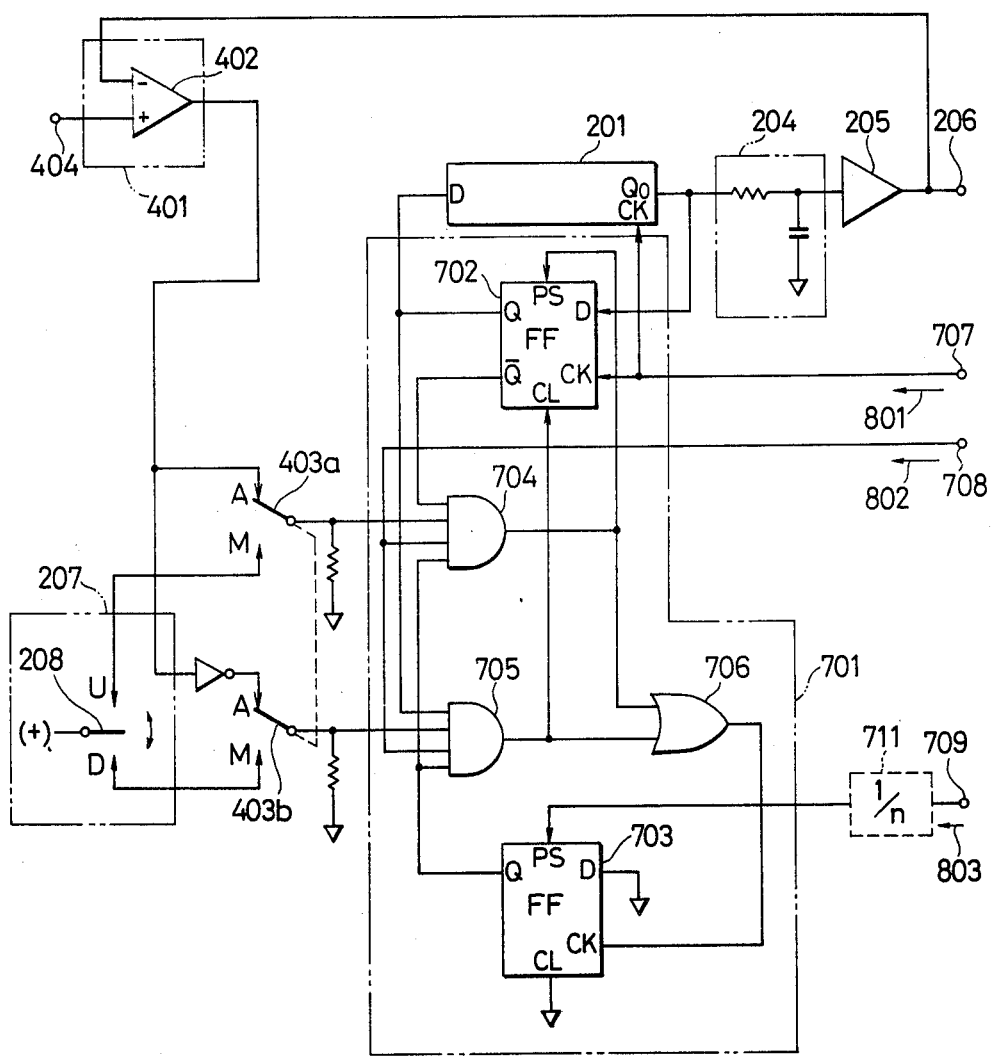
FIG. 7 is a circuit diagram illustrating another embodiment of the memory circuit of the present invention in which a memory write area is divided.

FIG. 7 illustrates another embodiment of the write means, in which the memory 201 is divided into a plurality of areas and means 701 is provided for writing data in each area. The write area dividing means 701 can be formed, for instance, by first and second D flip-flops 702 and 703, first and second gates 704 and 705 and an OR gate 706.

In this example the memory 201 is a shift register, which is driven by clock pulses 801 shown in FIG. 8A which are supplied from a terminal 707. The output read out from the memory 201 is provided via the smoothing circuit 204 and the buffer amplifier 205 to the output terminal 206 as is the case with the foregoing embodiments. The first D flip-flop 702 latches the output from the memory 201 in synchronism with the clock and rewrites therein the latched output. New writing in the memory 201 is carried out in synchronism with clock pulses 803 shown in FIG. 8C which are applied from a terminal 709. Assuming that the period $T_2$ of the clock pulses 803 is selected to be, for instance 16 times the period $T_1$ of the drive clock pulses 801, the write is performed at a speed 1/16 of the circulating speed of the memory 201. That is, the memory 201 is divided by steps of 16 bits and in this area of 16 bits is stored an analog quantity in the form of the duty ratio which is dependent on the ratio between the H and L logic signals in this example.

In either case where data is written in the memory 201 from the automatic write means 401 or manual write means 207, when a write command is one that is intended to increase the magnitude of the output analog signal, the numer of H logic in the memory 201 can not be increased if writing of H logic takes place only at the bit positions where H logic has been stored.

Therefore, the write area dividing means 701 operates so that write of the H logic signal based on the write command is not performed until an L logic signal is read out from the memory 201, and when the L logic signal is read out the H logic signal is written in the bit position in which the L logic signal was stored. Conversely, when the write command is supposed to decrease the magnitude of the output analog signal, the write area dividing means 701 operates so that only when an H logic signal is read out from the memory 201, an L logic signal is written in the bit position where the H logic signal was stored.

This control operation is carried out mainly by the gate 704 and 705. The gate 704 and 705 are controlled by the output from either of the automatic and the manual write means 401 and 207 to be opened and closed and vice versa, i.e. reverse in state from each other. To one input terminal of the gate 704 is applied the output from an output terminal $\overline{Q}$ of the first D flip-flop 702 and, at the same time, to another input terminal is provided via a mode changeover switch 403a an analog signal increase command signal which is output from the automatic or manual write means 401 or 207. Further, clock pulses 802 shown in FIG. 8B are applied to another input terminal of the gate 704. The clock pulses 802 lag the clock pulses 801 by a phase difference of 90° and are supplied from a terminal 708. To another input terminal of the gate 704 is applied an output signal from an output terminal Q of the second D flip-flop 703. The output from the gate 704 is supplied to a preset terminal PS of the first flip-flop 702 and, at the same time, it is provided via the OR gate 706 to a clock terminal CK of the second D flip-flop 703.

To one input terminal of the gate 705 is provided the output from an output terminal Q of the first D flip-flop 702 and to another input terminal is applied via a mode changeover switch 403b an analog signal decrease command signal from the automatic or manual write means 401 or 207. To another input terminal of the gate 705 is provided the clock pulses 802 from the terminal 708 and to still another input terminal is applied the output from an output terminal Q of the second D flip-flop 703. The output from the gate 705 is applied to a clear terminal CL of the first D flip-flop 702 and to the clock terminal CK of the second D flip-flop 703 via the OR gate 706. To a preset terminal PS of the second D flip-flop 703 is applied the clock pulses 803 shown in FIG. 8C. The frequency of the clock pulses 803 is selected lower than the frequencies of the clock pulses 801 and 802 as mentioned before. The clock pulses 803 are supplied from the terminal 709 to define the write period for the memory 201.

The automatic and manual write means 401 and 207 are changed over by the mode changeover switches 403a and 403b. As in the embodiments of FIGS. 4 and 5 that, contacts A and M of each of the switches 403a and 403b are representative of the automatic and the manual write mode, respectively. By changing over the mode changeover switches 403a and 403b from their automatic mode contacts A to the manual mode contacts M, the closed loop including the comparator 402 and the memory 201 is opened, by which the content of the memory 201 is retained in that state.

With the arrangement illustrated in FIG. 7, the each clock pulse 803 is provided to the preset terminal PS of the second D flip-flop 703 to invert its output terminal Q to H logic. By this inversion, H logic is applied to one of the input terminals of each of the gates 704 and 705. The H logic signal from the second D flip-flop 703 to each of the gates 704 and 705 acts as a write enable signal, by which the gates 704 and 705 are held in a state in which they output signals if other conditions are satisfied. The output signal from the gate 704 or 705 is provided to the clock terminal CK of the second D flip-flop 703. Since a data terminal D of the second D flip-flop 703 is connected to an L logic potential point, the output terminal Q of the second D flip-flop 703 is put in an L logic state when the gate 704 or 705 yields a pulse of H logic. As a consequence, until the clock pulse 803 is supplied next, the gates 704 and 705 are closed to provide a write disable state, in which the data of the memory 201 is not rewritten.

The conditions for which the gate 704 outputs a signal are as follows:

(1) The output from the automatic or manual write means 401 or 207 is H logic, that is, a signal increase command;

(2) the output read out from the memory 201 is an L logic signal;

(3) the second D flip-flop 703 is in its set state; and (4) the clock pulse 802 is present. When these conditions are fulfilled, the gate 704 yields a pulse synchronized with the clock pulse 802 and this output pulse presets the first D flip-flop 702 to invert its output terminal Q to H logic. By this inversion, H logic is written in the memory 201 at the bit position where L logic was stored. In this way, if the output from the automatic or manual write means 401 or 207 is in the state of the signal increase command, the number of bits of H logic in the memory 201 increases, rewriting its content in a direction in which to increase the analog output voltage at the terminal 206.

The conditions for which the gate 705 outputs a signal are as follows:

(1) The output from the automatic or manual write means 401 or 207 is a signal decrease command;

(2) The output read out from the memory 201 is H logic;

(3) The second D flip-flop 703 is in its set state; and (4) The clock pulse 802 is present. When these conditions are all satisfied, the gate 705 produces a pulse synchronized with the clock pulse 802 and, by this pulse, the first D flip-flop 702 is reset to invert the output at its output terminal Q into L logic. By this inversion, L logic is written in the memory 201 at the bit position where H logic was stored, by which the number of bits of L logic in the memory 201 is increased, reducing the value of the analog output voltage at the terminal 206.

FIGS. 8D to G show the above-described write operation in the automatic write mode, FIG. 8D showing data 804 read out from the memory 201 and FIG. 8E an analog signal 805 applied to the input terminal 404 and a signal 806 applied from the smoothing circuit 204 to the comparator 402. In FIG. 8E the output signal 806 from the smoothing circuit 204 is larger than the analog input signal 805 before a time $t_0$. Accordingly, the output from the comparator 402 is L logic (the signal decrease command) before the time $t_0$ as shown in FIG. 8F. FIG. 8G shows rewritten data of the memory 201. As illustrated, the L logic signals 807 are written on a bitwise basis in those portions where the read-out signal 804 of the memory 201 are H logic before the time $t_0$. After the time $t_0$, the output from the comparator 402 is H logic (the signal increase command) and H logic signals 808 are written on a bitwise basis in those portions where the read-out signal 804 of the memory 201 are L logic.

Figure 8:
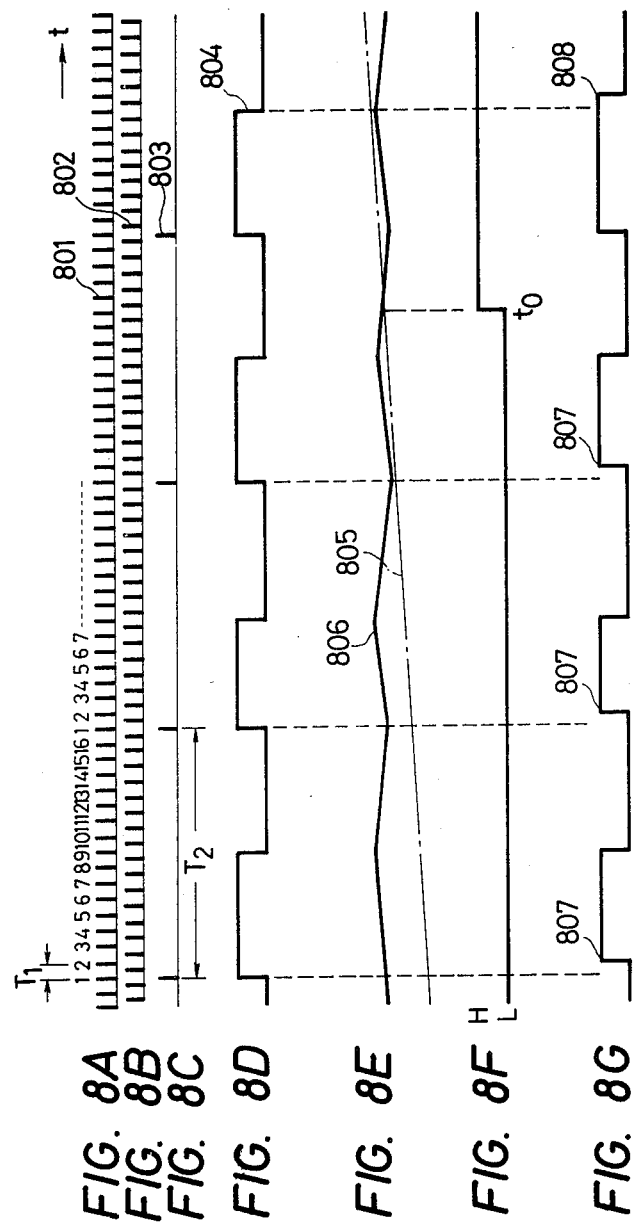
FIG. 8A-G are timing chart explanatory of the operation of the memory circuit depicted in FIG. 7.

In the example of FIG. 8, the period $T_2$ of the clock pulses 803 is selected to be 16 times that $T_1$ of the clock pulses 801. In the case where the memory 201 is a shift register, for instance, of 256 bits, the memory 201 is equally divided by the clock pulses 803 into 16 areas, in which an analog quantity is stored in the form of the ratio between the number of H and L logic signals. By such division of the storage area of the memory 201 into a plurality of areas, the frequency of the read-out signal 804 (FIG. 8D) can be selected high. Accordingly, the time constant of the smoothing circuit 204 can be set small, by which it is possible to reduce a time lag of the output voltage at the output terminal 206 behind the data rewriting of the memory 201; namely, the response speed can be raised.

When changing over the mode changeover switches 403a and 403b to the contacts M for manual operation, the closed loop formed by the memory 201 and the automatic write means 401 is opened and the analog data stored in the memory 201 in a binary form keeps on circulating therein with no change, permitting the smoothed output voltage at the output terminal 206 to be stably held without drift for a long period of time. In this case, if the manual switch 208 is connected to the contact U, then H logic is applied to the gate 704. As a result of this, by the operation described previously, H logic is written with the period of the clock pulse 803, in the memory 201 in the bit positions where L logic signals have been stored until then, causing a gradual increase in the number of bits of H logic in the memory 201. In the case of the manual switch 208 being connected to the contact D, H logic is applied to the gate 705 and L logic is written, with the period of the clock pulse 803, in the memory 201 at the bit positions where H logic signals have been stored. In consequence, the analog output voltage at the terminal 206 gradually decreases.

The rate at which the analog output voltage rises and drops during the automatic and the manual operation is dependent on the frequency of the clock pulses 803. Accordingly, it is desirable to select the frequency of the clock pulses 803 so that, for instance, an operation of bringing the analog output voltage value into agreement with a predetermined value while observing an indicator (not shown) can be carried out with much ease. By connecting a variable frequency divider 711 between the terminal 709 and the second D flip-flop 703 as indicated in broken line in such a manner that the frequency of the clock pulse 803 to be supplied to the D flip-flop 703 may be changed by the variable frequency divider 711, the increasing and decreasing speeds of the output analog signal can be changed as desired or in accordance with the amount of variations in the output analog signal during manual operation.

Figure 9:
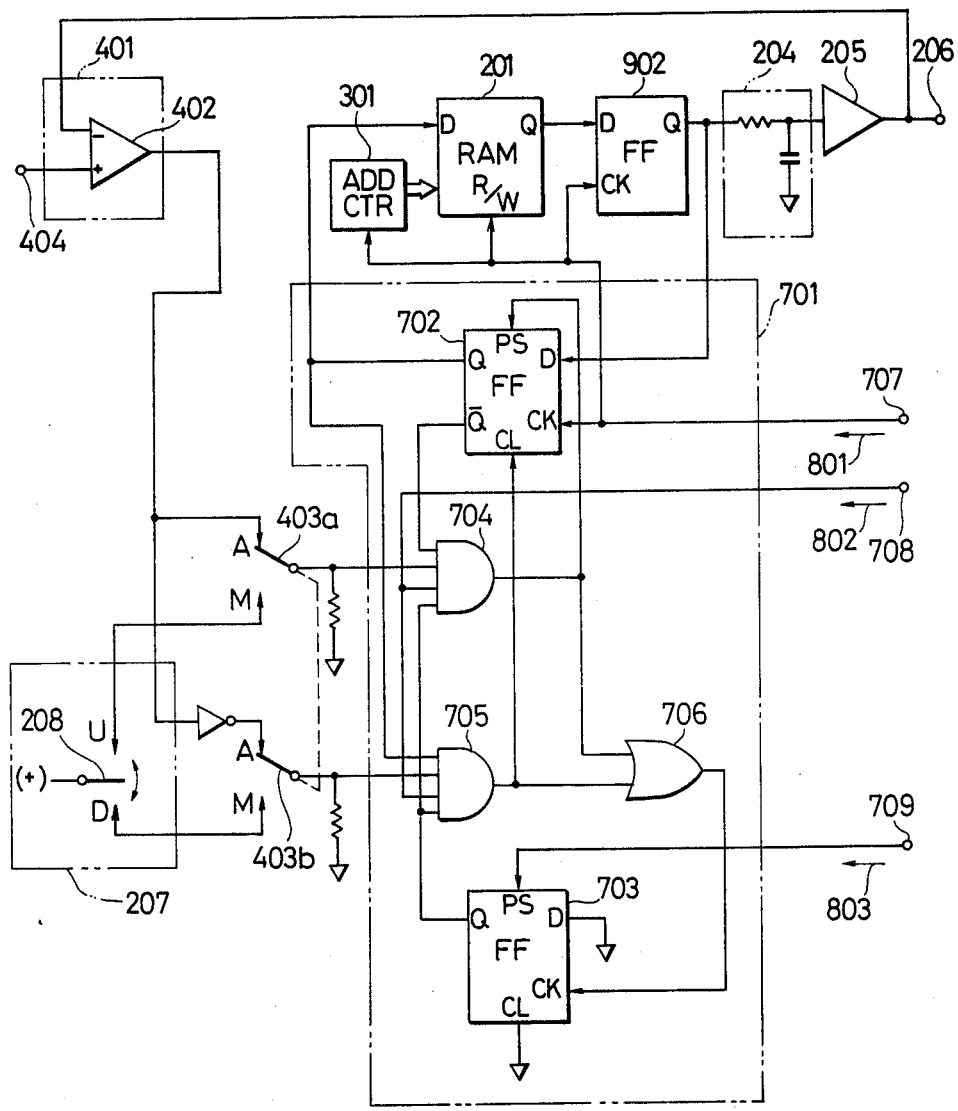
FIG. 9 is a diagram showing a modified form of the embodiment of FIG. 7 in which a RAM is used as the memory.

FIG. 9 illustrates another embodiment of the present invention, in which a random access memory (hereinafter referred to as a RAM) is employed as the memory 201 in the embodiment of FIG. 7. In the case of using the RAM as the memory 201, the clock pulse 801 is provided to an address counter 301 and, by its count output, the memory 201 is cyclically accessed from the leading address to the last address. At the same time, the clock pulse 801 is applied to a read/write terminal R/W of the memory 201 and the stored content of the memory 201 is read out from the address designated by the address counter 301 in response to H logic of the clock pulse 801. The output read out from the memory 201 is latched in a third D flip-flop 902 and its output is latched by the clock pulse 801 in the first D flip-flop 702. When the clock pulse 801 falls to L logic the Q output of the first D flip-flop 702 is written in the memory 201 at the address which was just read out. The output from the third D flip-flop 902 is supplied to the smoothing circuit 204, too. Since the embodiment of FIG. 9 is exactly the same as the embodiment of FIG. 7 in the other arrangements and in operation, no more detailed description will be given.

Figure 10:
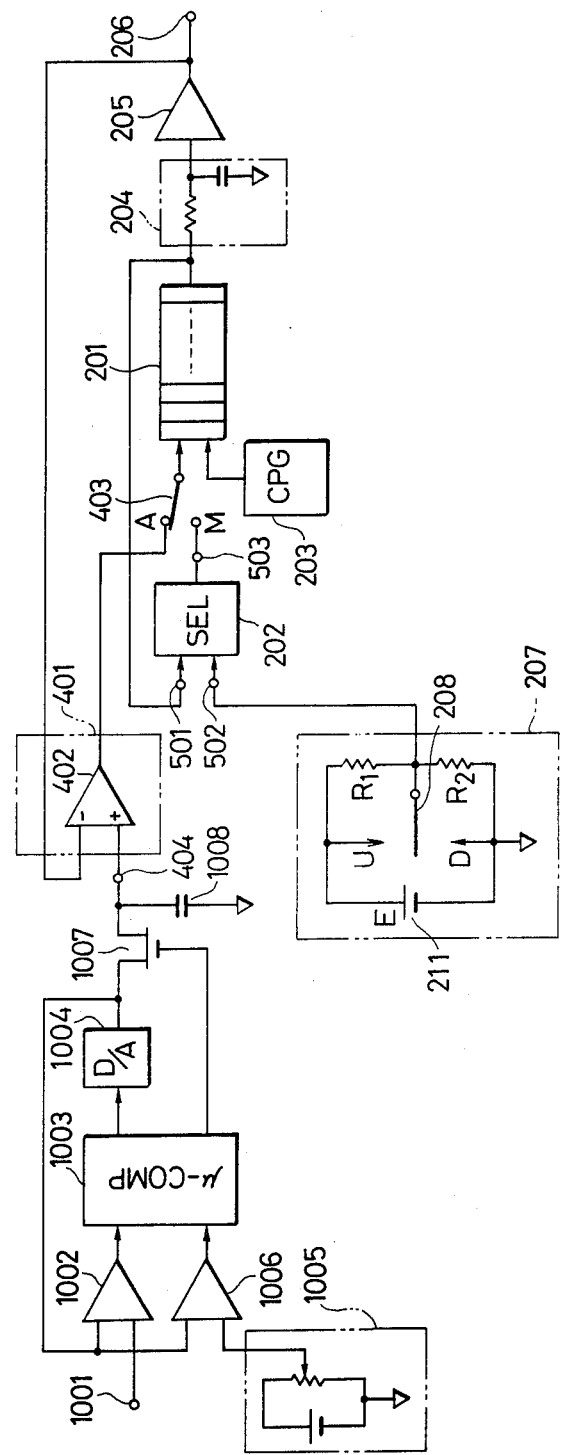
FIG. 10 is a circuit diagram illustrating another embodiment of the present invention in which the circuit of FIG. 4 is applied to an output circuit of an indicating controller.

FIG. 10 illustrates an example of the memory circuit of FIG. 4 as being applied to an indicating controller. To an input terminal 1001 is applied such as a measured flow rate, pressure or temperature signal. The measured signal is provided to one of input terminals of a comparator 1002. A D/A converter 1004 is connected to the output side of a microcomputer 1003 and the output from the D/A converter 1004 is applied to the other input terminal of the comparator 1002. A loop of the comparator 1002, the microcomputer 1003 and the D/A converter 1004 are so arranged as to perform an A/D converting operation as is well-known in the art. By the A/D converting operation the analog measured value is converted to digital form and is available in the microcomputer 1003. An analog set value from a setter 1005 is similarly converted by a loop of a comparator 1006, the microcomputer 1003 and the D/A converter 1004 into a digital value, which is available in the microcomputer 1003.

In the microcomputer 1003 the measured value and the set value thus obtained in digital form are compared with each other and the difference value therebetween is subjected to a PID (Proportional plus Integral plus Derivative) operation. The result of the operation is periodically provided via the D/A converter 1004 and a sampling switch 1007 to a sample hold capacitor 1008, thus holding therein the indicating controller output. The indicating controller output held in the capacitor 1007 is applied to the input terminal 404 of the memory circuit of the present invention described previously in respect of FIG. 4, and H and L logic signals are written via the automatic write means 401 in the memory 201 in the ratio between the numbers of H and L logic signals corresponding to the voltage value held in the capacitor 1008. That is to say, as described previously, since the output read out from the memory 201 is smoothed by the smoothing circuit 204 and applied to the other input terminal of the comparator 402 of the automatic write means 401, the H and L logic signals are written in the memory 201 in such a manner that the output value from the controlling indicator provided to the input terminal 404 and the output from the smoothing circuit 204 may be in equilibrium. When the mode changeover switch 403 is changed over to the manual mode contact M, the output value of the indicating controller stored in the memory 201 is continuously provided to the output terminal 206 and this output value is semipermanently held without drift.

Accordingly, when the memory circuit of the present invention is applied to the output circuit of the indicating controller, even if the indicating controller is allowed to stand for a long time in the manual mode, the output would not drift. Therefore, a high reliability indicating controller can be obtained. Moreover, in the case where the microcomputer 1003 gets out of order, the voltage at the output terminal 206 can be held unchanged by changing over the mode changeover switch 403 to the manual mode contact M; therefore, in this point, too, a highly reliable indicating controller can be provided.

Figure 11:
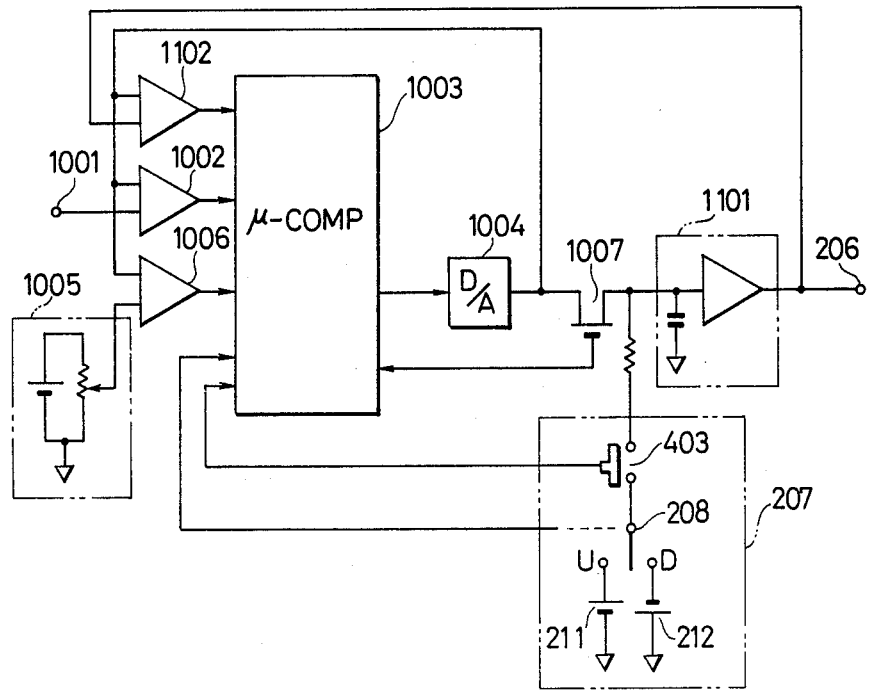
FIG. 11 is a circuit diagram showing a conventional indicating controller.

In a conventional indicating controller utilizing a microcomputer, as shown in FIG. 11, while in the manual mode, the output from a sample hold circuit 1101 is fed back to a comparator 1102 on the input side and, by the comparator 1102, the microcomputer 1003 and the D/A converter 1004, a drift of the sample hold circuit 1101 is input into the microcomputer 1003 for correcting the drift through utilization of the arithmetic operating function of the microcomputer 1003. Consequently, the prior art indicating controller has the defect that when the microcomputer 1003 is out of order, the output drifts while in the manual mode.

It will be appreciated that the memory circuit of the present invention excels the conventional drift correcting system in the signal retaining function and in that the system process can be safely continued by manual operation for a long time even if the microcomputer 1003 is out of order.

Figure 12:
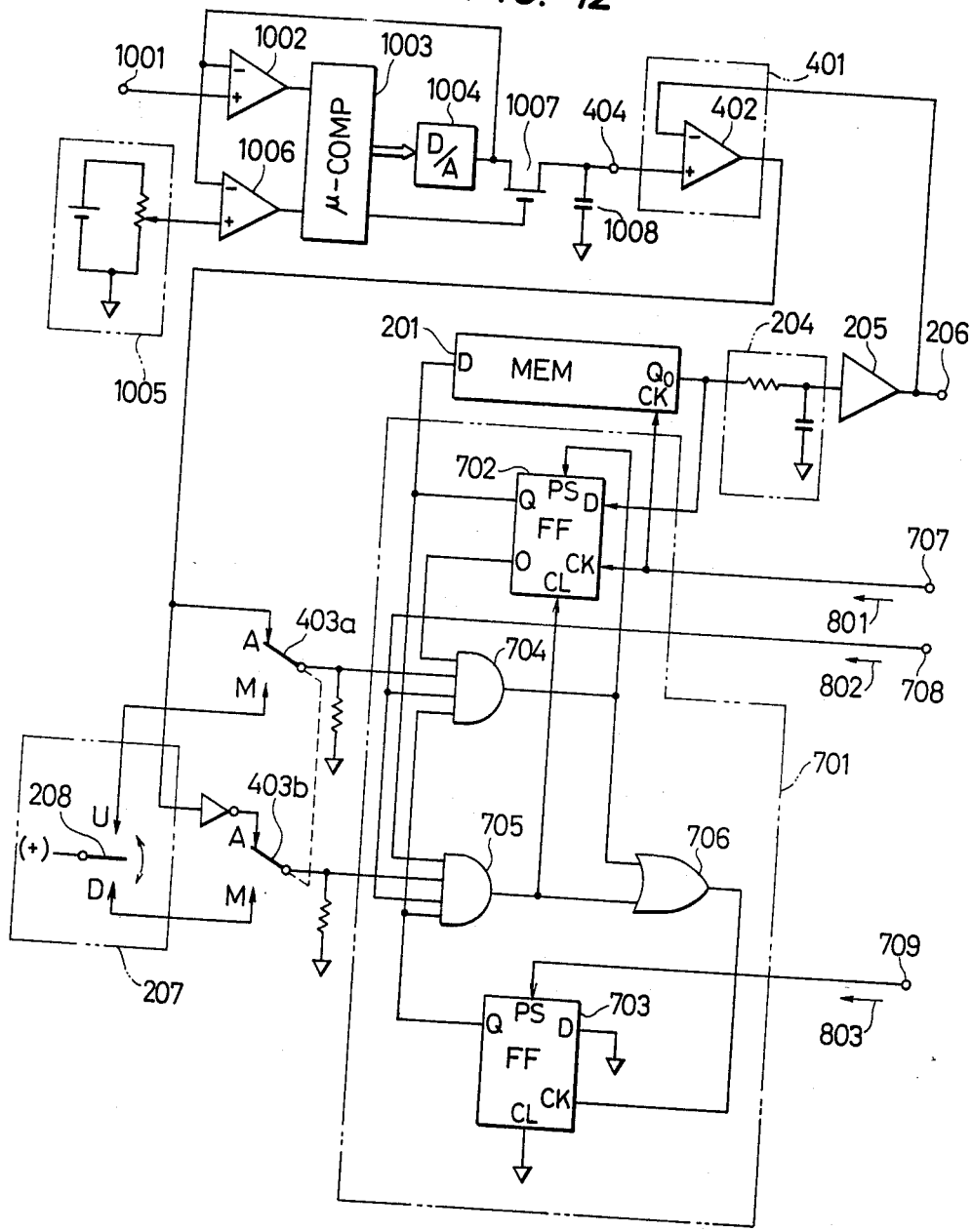
FIG. 12 is a circuit diagram illustrating another embodiment of the present invention in which the circuit of FIG. 7 is applied to the output circuit of the indicating controller.

FIG. 12 illustrates another embodiment of the present invention in which the write means described previously in connection with FIG. 7 is applied to an indicating controller. This embodiment is also identical with the embodiment of FIG. 10 in that the hold capacitor 1008 is connected to the input terminal 404 of the automatic write means 401, and in that the D/A converter 1004, the microcomputer 1003, the comparators 1002 and 1006 for A/D conversion and the setter 1005 are provided. The operational effect of the indicating controller is exactly the same as that described previously with regard to FIG. 10; namely, while in the manual mode, the output signal remains unchanged and breakdown of the microcomputer 1003 does not affect the system process.

Figure 13:
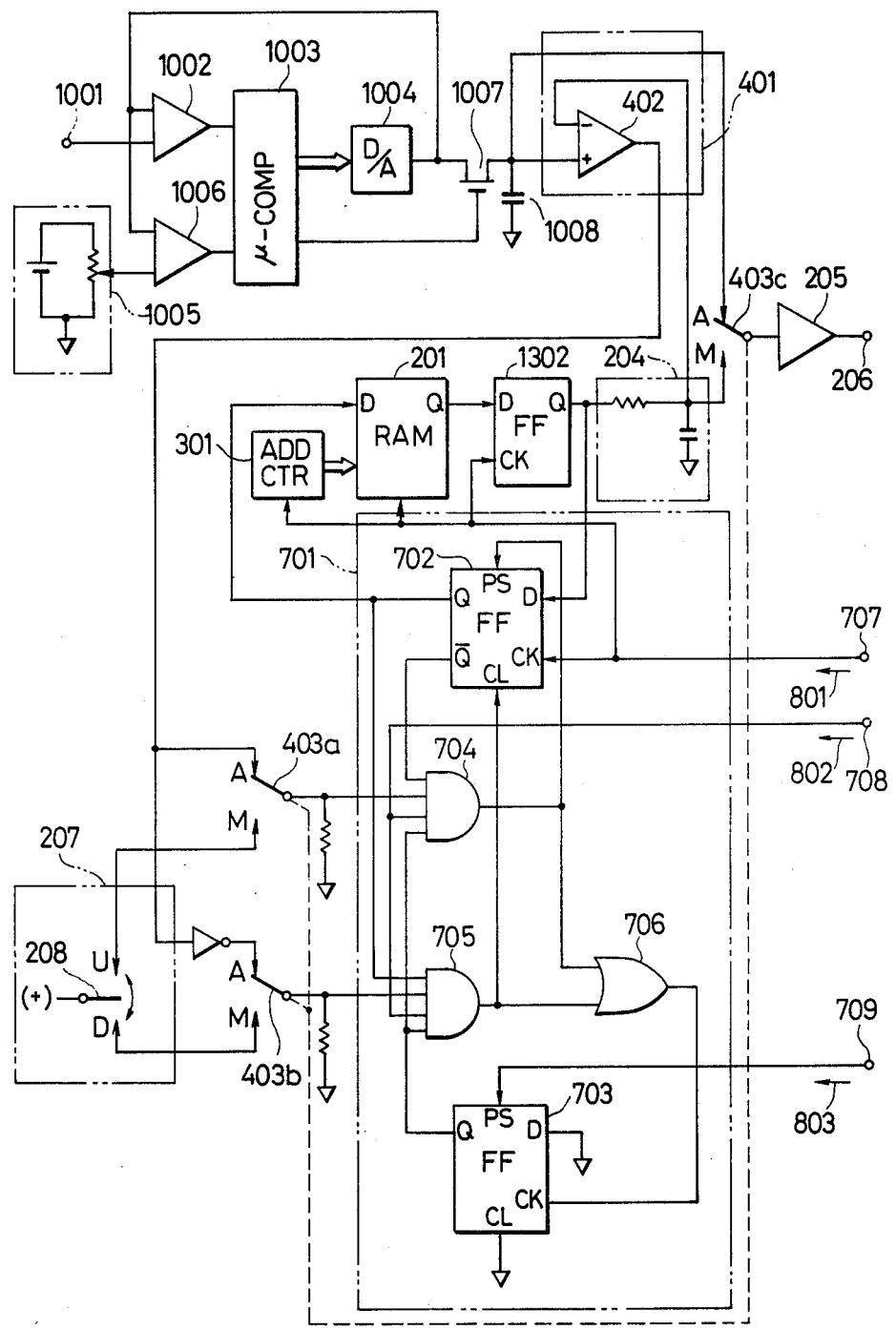
FIG. 13 is a circuit diagram illustrating another embodiment of the present invention in which the circuit of FIG. 9 is applied to the output circuit of the indicating controller and the output from a holding capacitor is directly output during automatic write.

FIG. 13 illustrates another embodiment of the present invention in which the memory circuit using a RAM as the memory 201 as described previously in respect of FIG. 9 is applied to the indicating controller. This embodiment differs from the embodiments of FIGS. 10 and 12 in the following point: A mode changeover switch 403c is provided on the output side of the smoothing circuit 204 and, while in the manual mode, the indicating controller output held in the sample hold capacitor 1008 is directly output to the output terminal 206 via the buffer amplifier 205 and, only in the manual mode, the output read out from the memory 201 is used as the analog output at the output terminal 206. The other arrangements of this embodiment are exactly identical with those of the embodiment of FIG. 12 except that the memory 201 is a RAM.

Figure 14:
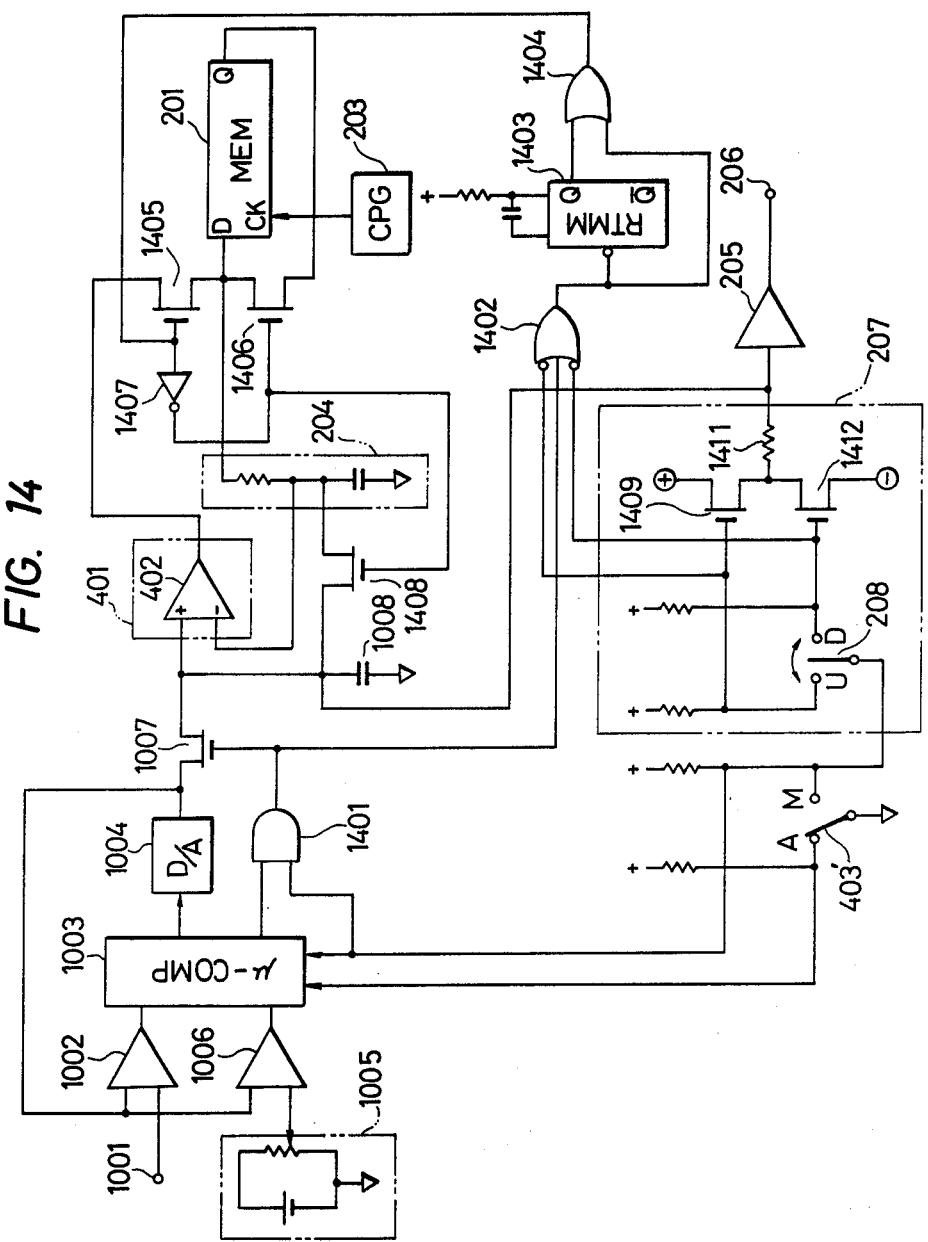
FIG. 14 is a circuit diagram illustrating another embodiment of the present invention in which the circuit of FIG. 5 is applied to the output circuit of the indicating controller.

FIG. 14 illustrates another embodiment of the present invention in which the memory circuit using the write means described previously with respect to FIG. 5 is applied to the indicating controller. In this embodiment, while in the automatic mode, a sampling signal applied via an AND gate 1401 to the sampling switch 1007 is also provided via a gate 1402 to a retriggerable monostable multivibrator 1403. In the automatic mode the retriggerable monomultivibrator 1403 is held in its set state and its set output is applied via an OR gate 1404 to a switch 1405 to hold it in the ON state, permitting therethrough the passage of the output from the automatic write means 401 to the memory 201. The output from the retriggerable monostable multivibrator 1403 is provided via an inverter 1407 to switches 1406 and 1408 to hold them in the OFF state in the automatic mode.

As a result of this, in the automatic mode the indicating controller output held in the sample hold capacitor 1008 is directly applied to the output terminal 206 via the buffer amplifier 205. At the same time, the sample hold voltage is applied to the one input terminal (+) of the comparator 402 constituting the automatic write means 401 and the output from the comparator 402, smoothed by the smoothing circuit 204, is applied to the other input terminal (−) of the comparator 402. Consequently, the comparator 402 continuously yields pulses having a duty ratio proportional to the sample hold voltage, which pulses are written in the memory 201. Accordingly, in the memory 201 H and L logic are stored in a ratio corresponding to the duty ratio of the pulses derived from the comparator 402.

When changing over a mode control switch 403' to the manual mode contact M, the AND gate 1401 is closed to cut off the sampling signal to the sampling switch 1007, by which, after certain elapsed time, the retriggerable monomultivibrator 1403 is altered to its reset state, turning OFF the switch 1405 and turning ON the switches 1406 and 1408. Upon turning ON of the switch 1406, the memory 201 operates as a circulating register; namely, its output is rewritten and the data stored until then circulates in the memory 201. The circulating data is taken out via the smoothing circuit 204 and applied via the switch 1408 to the sample hold capacitor 1008. Accordingly, in the manual mode the output is held unchanged corresponding to the duty ratio of the data circulating in the memory 201 provided that the manual switch 208 is kept neutral.

When connecting the manual switch 208 to the contact U, the switch 1409 is turned ON, applying a positive constant current to the sample hold capacitor 1008 via a resistor 1411. In this case, by the connection of the manual switch 208 to the contact U, the retriggerable monostable multivibrator 1403 is triggered via the NOR gate 1402, turning ON the switch 1405 and turning OFF the switches 1406 and 1408. In consequence, the comparator 402 constitutes a closed loop together with the smoothing circuit 204 and produces pulses of a duty ratio corresponding to the charged voltage of the sample hold capacitor 1008, and the duty ratio of the pulses is stored in the memory 201. On the other hand, when the manual switch 208 of the manual write means 207 is connected to the contact D, a switch 1412 is turned ON, applying a negative constant current to the capacitor 1008. By the negative current the sample hold voltage is gradually reduced and the duty ratio of the output pulses from the comparator 402 also varies in a direction in which to diminish. The variation in the duty ratio is stored in the memory 201 every moment. Incidentally, the switches 1405 to 1408 are those which turn ON by application of H logic to their gates, while the switches 1409 and 1412 are those which turn ON by application of L logic to their gates. The switches 1405 and 1406 constitute the mode changeover switch 403 seen in FIG. 5.

By returning the manual switch 208 to its neutral position, charging and discharging of the capacitor 1008 are stopped and, after a certain elapsed time, retriggerable monostable multivibrator 1403 returns to its reset state and the memory 201 is switched to a circulating register and its smoothed output is applied via the switch 1408 to the capacitor 1008, outputting a final value in the manual mode. Since the output value is the output read out from the memory 201, it is held unchanged semipermanently.

As has been described in the foregoing, according to the present invention, it is possible to provide a memory circuit which is capable of holding an analog signal quantity unchanged for a long time. Accordingly, for instance, an indicating controller of high reliability can be obtained by the application thereto of the memory circuit. Furthermore, even if the memory circuit of the present invention is applied to a manual operator, its set value can be held unchanged for a long time, so that a highly reliable manual operator can be obtained. Moreover, the memory circuit of the present invention comprises the write means 401 and 207 in addition to the memory 201 and the smoothing circuit 204, and hence it is simple in construction and can be fabricated at low cost. Therefore, the present invention is of great utility in practical use.

It will be apparent that many modifications and variations may be effected without departing from the scope of the novel concepts of the present invention.

What is claimed is:

1. A memory circuit for producing an analog signal of a desired magnitude comprising:
   memory means having a plurality of accessible memory locations each of which contains one-bit data indicating either H or L logic;
   cyclic access means for cyclically and successively accessing all of said memory locations of said memory means into and out of which data is to be read;

write means for producing levels of H and L logic to be written into the memory locations accessed by said cyclic access means so that the ratio between the numbers of H logic data and L logic data in all of said memory locations corresponds to the magnitude of an analog signal to be produced; and a smoothing circuit coupled to said memory means for smoothing data read out of said memory means by operation of said cyclic access means to produce an output analog signal of the desired magnitude.

2. A memory circuit according to claim 1 wherein said write means is a manual write means which comprises a first signal source for generating one of said H and L logic signals, a second signal source for generating the other of said H and L logic signals, and a manually operable switch connectable to each of the first and second signal sources and capable of assuming a neutral state of disconnection from either of them for selectively supplying the signals from the first and second signal sources to said memory means.

3. A memory circuit according to claim 2 wherein a selector is connected between the output sides of the manual write means and the memory means and the input side of the memory means, for outputting the signal of the first or second signal source when the manual write means is connected thereto and outputting the output from the memory means when the manual write means is set in the neutral state.

4. A memory circuit according to claim 1 wherein said write means is an automatic write means for automatically writing the H and L logic signals into said memory means in the ratio between the numbers of the H and L logic signals corresponding to the magnitude of an input analog signal from an analog input terminal, the automatic write means comprising a comparator for comparing said input analog signal and said output analog signal to yield either one of the H and L logic signals in accordance with the difference between said input analog signal and said output analog signal, the memory means including a mode changeover switch for switching between an automatic write mode in which the automatic write means is connected to the memory means to write therein the H and L logic signals and a hold mode in which the automatic write means is disconnected from the memory means to hold the signals stored therein.

5. A memory circuit according to claim 4 wherein the mode changeover switch connects the output side of the comparator to the input side of the memory means in the automatic write mode, the output side of the memory means being connected to the smoothing circuit at all times.

6. A memory circuit according to claim 5 wherein the mode changeover switch, when set to the hold mode, is connected to the output side of a manual write means, and wherein the manual write means comprises a first signal source for generating one of the H and L logic signals, a second signal source for generating the other of said signals, and a manually operable switch capable of assuming a state of connection to each of the first and second signal sources and a neutral state of disconnection from either of them, a movable contact of the manually operable switch being the output side of the manual write means.

7. A memory circuit according to claim 6 wherein a selector is connected between the output sides of the manual write means and the memory means and the hold mode side of the mode changeover switch, for outputting the signal of the first or second signal source when the manual write means is connected thereto and outputting the output from the memory means when the manual write means is set in the neutral state.

8. A memory circuit according to claim 4 wherein the smoothing circuit is always connected to the input side of the memory means, and the mode changeover switch connects the output side of the comparator to the input side of the memory means in the automatic write mode and connects the output side of the memory means to the smoothing circuit in the hold mode.

9. A memory circuit according to claim 8 wherein the memory means is a shift register which is shifted by clock pulses of a fixed period.

10. A memory circuit according to claim 4, comprising a holding capacitor connected to the analog input terminal and to an analog output terminal for outputting the hold voltage as the output analog signal, first switch means being connected between an analog input signal source and the holding capacitor for providing an analog input signal from the analog input signal source to the holding capacitor via the first switch means; the smoothing circuit being normally connected to the input side of the memory means, the mode changeover switch connecting the output side of the comparator to the input side of the memory means when in the automatic write mode and connecting the output side of the memory means to the smoothing circuit when in the hold mode; and in the hold mode the output side of the smoothing circuit being connected to the holding capacitor via a second switch means.

11. A memory circuit according to claim 10 comprising means for sampling and supplying an operation signal output of an indicating controller to the holding capacitor via the first switch means; mode control switch means for changing over between the automatic write mode and the hold mode; manual switch means having a neutral position, an increase command position and a decrease command position and being operable, when the mode control switch means is set to the automatic write mode and when the manual switch means is set to the increase command position, to supply charging current to the holding capacitor, and being operable when the manual switch means is set to the decrease command position, to discharge the holding capacitor; and control means for turning ON the second switch means and setting the mode changeover switch to the write mode either when the sampling is performed or the manual switch means is set to either of the increase command position and the decrease command position and for turning OFF the second switch means and setting the mode changeover switch to the holding mode a predetermined time after the sampling is completed or the manual switch means is set to the neutral position.

12. A memory circuit according to claim 1 wherein a write area dividing means is provided between the memory means and the write means for dividing the memory means into a plurality of areas for writing by the write means.

13. A memory circuit according to claim 12 wherein the write area dividing means comprises means for placing the memory means in a write enable state at a timing which constitutes an integral fraction of the period of circulation of the memory means for the readout thereof, and for placing the memory means in a write disable state after each write into the memory means.

14. A memory circuit according to claim 12 wherein the write area dividing means comprises delay means for delaying the output from the memory means for at least one bit for rewriting the output into the memory means, write enable signal generating means for generating a write enable signal at intervals of an integral fraction of the period of circulation of the memory means for the readout thereof, and means for detecting coincidence among the write enable signal, a write command from the write means and a signal read out from the memory means which is reverse in logic state from the write command, setting the output from the delay means in agreement with the content of the write command and stopping the generation of the write enable signal from the write enable signal generating means.

15. A memory circuit according to claim 14 wherein the write means comprises automatic write means, manual write means, and a mode changeover switch for selectively connecting the output sides of the automatic write means and the manual write means to the write area dividing means, the automatic write means comprising a comparator for comparing an input analog signal from an analog input terminal and the analog signal from the smoothing circuit to output either one of them, and the manual write means comprising a manually operable switch having a changeover position for outputting a write command for one of the H and L logic signals, a changeover position for outputting a write command for the other of the H and L logic signals and a neutral position to output neither of the write commands.

16. A memory circuit according to claim 14 or 15 which includes means for changing the period of generation of the write enable signal from the write enable signal generating means.

17. A memory circuit according to claim 1, 2, 4, 12, 13, 14 or 15 wherein the memory means is a circulating shift register which is shifted by clock pulses of a fixed period and the output of which is fed back to the input side thereof.

18. A memory circuit according to claim 1, 2, 4, 5, 8, 12, 13, 14 or 15 wherein the memory means is a read/write memory which is accessed by the count value of an address counter which counts clock pulses of a fixed period.

19. A memory circuit according to claim 6 or 15 wherein a holding capacitor is connected to the analog input terminal and means is provided for sampling and supplying an operation signal output of an indicating controller to the holding capacitor.

20. A memory circuit according to claim 19 wherein a changeover switch is provided for selectively connecting the analog input terminal and the output side of the smoothing circuit to an analog output terminal.

* * * * *

UNITED STATES PATENT AND TRADEMARK OFFICE
CERTIFICATE OF CORRECTION

PATENT NO. : 4,573,142

DATED : February 25, 1986

INVENTOR(S) : Tadashi Azegami

It is certified that error appears in the above-identified patent and that said Letters Patent is hereby corrected as shown below:

In the Heading:

Correct the assignee to: Yokogawa Hokushin Electric Corporation

Signed and Sealed this

Twenty-sixth Day of August 1986

[SEAL]

Attest:

DONALD J. QUIGG

Attesting Officer

Commissioner of Patents and Trademarks